US006389525B1

(12) United States Patent
Reichert et al.

(10) Patent No.: US 6,389,525 B1
(45) Date of Patent: May 14, 2002

(54) PATTERN GENERATOR FOR A PACKET-BASED MEMORY TESTER

(75) Inventors: Peter Reichert, Thousand Oaks; Bill Sopkin; Chris Reed, both of Oxnard, all of CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/227,690

(22) Filed: Jan. 8, 1999

(51) Int. Cl.[7] .............................................. G06F 12/00
(52) U.S. Cl. ...................... 711/217; 711/104; 711/154; 714/718; 714/720
(58) Field of Search ............................ 711/100, 104, 711/137, 217, 154; 714/718, 720, 724

(56) References Cited

U.S. PATENT DOCUMENTS

| | | | |
|---|---|---|---|
| 5,214,654 A | | 5/1993 | Oosawa |
| 5,369,617 A | * | 11/1994 | Munson ........................ 365/219 |
| 5,522,050 A | * | 5/1996 | Amini et al. ................ 710/126 |
| 5,794,175 A | | 8/1998 | Conner |
| 5,796,748 A | | 8/1998 | Housako et al. |
| 5,812,488 A | | 9/1998 | Zager et al. |
| 5,835,969 A | | 11/1998 | Inagaki et al. |
| 5,983,303 A | * | 11/1999 | Sheafor et al. ............. 710/126 |
| 6,029,262 A | * | 2/2000 | Medd et al. ................. 714/724 |
| 6,212,615 B1 | * | 4/2001 | Takahashi ................... 711/219 |
| 6,282,134 B1 | * | 8/2001 | Kumar ........................ 365/201 |
| 6,286,120 B1 | * | 9/2001 | Reichert et al. ............. 714/738 |

FOREIGN PATENT DOCUMENTS

EP          0 847 060 A       6/1998        ........... G11C/29/00

OTHER PUBLICATIONS

"Meet Synchronous Memory Test Challenges," Test and Measurement World. (Inc. Electronics Test), vol. 17, No. 1, Jan. 1, 1997, pp. 29–30, 33–34, 36, XP000684737.

* cited by examiner

*Primary Examiner*—Tuan V. Thai
(74) *Attorney, Agent, or Firm*—Lanie Kreisman

(57) ABSTRACT

A pattern generator for use in a memory tester to provide packet address and data signals to a packet-based memory-under-test is disclosed. The pattern generator includes an address source for generating an external packet memory address signal. The external packet memory address signal represents a plurality of addressable memory elements in the memory-under-test. A plurality of data generators are disposed in parallel relationship and coupled to the output of the address source to receive at least a portion of the packet memory address signal. Each of the data generators has logic operative to derive an internal address from the packet address. The internal address corresponds to an individual memory element within the memory under test. A sequencer is disposed at the outputs of the data generators to distribute the data generator outputs in a packet waveform for application to the memory-under-test.

8 Claims, 5 Drawing Sheets

PATTERN GENERATOR FOR A PACKET-BASED MEMORY TESTER

FIELD OF THE INVENTION

The invention relates generally to automatic test equipment for testing semiconductor devices, and more particularly a pattern generator for use in a memory tester to test burst or packed-based memory devices.

BACKGROUND OF THE INVENTION

Random Access Memory (RAM) comprises the largest segment of the semiconductor memory market. Of the numerous kinds of RAM memories, one of the more dominant memory types is Dynamic RAM (DRAM). The high performance and low cost characteristics of DRAM make it suitable for mass applications in PC and workstation main memories.

In an effort to improve the data rates to and from DRAM memories, memory manufacturers have devised ways of accessing groups of cells in the memory core in bursts, or packets. These memories, such as Rambus Direct DRAM (DRDRAM), are often referred to as burst or packet-based memories. The memory structure generally includes a plurality of input/output (I/O) pins that double as both inputs and outputs for the device. Each I/O pin receives and sends respective packet signals of predetermined burst lengths to and from the device.

The packets generally comprise respective serial-bit waveforms that contain address bits specifying locations in the memory for storing data bits. Each packet includes a single packet address that identifies a device-under-test (DUT) column and row location for initially accessing a group of cells from the memory core. A plurality of data bits in the packet are then read from or written to the core with respect to the single packet address according to a DUT mapping methodology.

In conventional memory testers for conventional 1-bit wide memory devices, data generators in the tester generate data bits for application to the DUT according to the address information. Conventional data generators typically have single-bit outputs and require as inputs a cell address that designates where the data is to be applied in the DUT. An algorithmic pattern generator generally specifies the row and column location, or address, for each data bit and feeds the address information to the data generator. The data bits are then written to the specified addresses in the DUT core and subsequently read from the DUT and compared to expected data values to determine whether any failures occurred.

For conventional memory devices having 1-bit widths, data patterns are written to the device in a straightforward manner based on the row and column address of the physical memory array. Moreover, the serial bit rate of the address and data bits typically correspond to the operating frequency of the DUT.

However, at the present time, most DRAMS are 16-bits wide. Rambus Direct DRAM is an 18-bit wide part with a burst length of 8 words. This generally means that the internal memory array of the DUT is accessed 144 bits at a time (8*18=144).

In order to accurately test the internal cells of the memory core, the writing and reading of the data from and to the DUT must be done in a predictable and repetitive manner. Thus, the individual data bits for each packet must have respective addresses corresponding to a specific cell in the core in order for the tester to successfully track the actual versus expected data values from the DUT.

One possible solution to testing packet-based memories involves implementing an address generator that matches the DUT frequency. With RAM devices expected to exceed the 1 GigaHertz threshold, such an address generator would be difficult to implement. Further, unless one of the generated addresses for data generation corresponds to the address the user desires to apply to the address pins of the DUT, the tester would have to generate an additional address.

An alternative solution to the single high-speed address generator proposed above is to provide a plurality of slower pattern generators in parallel, each having respective address generators. A proposal similar to this solution is disclosed in U.S. Pat. No. 5,796,748 to Housako et ai. To test a memory having an operating frequency M with a pattern generator of a frequency L, N pattern generators are used in parallel according to the relationship $M=N \times L$.

Although the multiple-pattern generator solution is allegedly easier to implement due to the individually slower speeds, it requires N times the amount of hardware. This is highly undesirable when attempting to minimize the number of gates on integrated circuits, and the size of the circuits. Moreover, like the single high-speed address generator approach, unless one of the data bit's addresses can be used for the DUT, the tester must, for example, generate a $9^{th}$ address.

An additional problem with both approaches above involves the relative difficulty for the user in programming software to keep all the data bit addresses in sync as they are applied to the DUT. As an example, for a given address associated with bit "0", there is only one legal address for bits "1" through "N". It could be a fairly monumental task to debug such programmed patterns.

What is needed and heretofore unavailable is a memory tester that offers a minimal hardware solution to the address problem described above in testing packet-based memory devices. Moreover, the need exists for such a memory tester to have such capability with little modification to conventional memory tester constructions. Further, the need exists for testing packet-based memory devices while providing maximum operating convenience for a user. The packet-based memory tester of the present invention satisfies these needs.

SUMMARY OF THE INVENTION

The packet-based memory tester of the present invention provides a unique pattern generator that offers a minimal hardware-based solution to identifying the internal addresses of a DUT that are associated with a DUT packet address. The solution provides this capability with minimal modifications to existing hardware designs and maximizes the operating convenience of the tester for a user.

To realize the foregoing advantages, the invention in one form comprises a pattern generator for use in a memory tester to provide packet address and data signals to a packet-based memory-under-test. The pattern generator includes an address source for generating an external packet memory address signal. The external packet memory address signal represents a plurality of addressable memory elements in the memory-under-test. A plurality of data generators are disposed in parallel relationship and coupled to the output of the address source to receive at least a portion of the packet memory address signal. Each of the data generators have logic operative to derive an internal address from the packet address. Each internal address corresponds to an individual memory element within the memory under test. A sequencer is disposed at the outputs of the data generators to distribute the data generator outputs in a packet waveform for application to the memory-under-test.

In another form, the invention comprises a semiconductor memory tester including a user workstation and a tester body responsive to the user workstation. The tester body includes control logic for generating test commands, and a pattern generator for generating packet address and data signals for application to the memory-under-test. The pattern generator includes an address source and a plurality of data generators coupled in parallel to the address source. The data generators have logic to receive a portion of the packet address signal and operative to derive respective internal addresses of the memory-under-test from the packet address. The pattern generator further includes a sequencer to distribute the data generator outputs into a packet waveform. Conditioning circuitry is disposed at the output of the sequencer in the tester body to format the waveform. A test head couples to the tester body and includes interface circuitry adapted to couple to the memory-under-test to drive signals to and compare signals from the memory-under-test.

In yet another form, the invention comprises a data generator for use in a pattern generator adapted to test packet-based memory devices. The data generator includes a row address input for receiving a packet row address, a column address input for receiving a packet column address, and logic having an input for receiving the packet column address. The logic is operative to derive a plurality of internal addresses from the packet address.

In yet another form, the invention comprises a burst address control circuit for use in a pattern generator adapted to test packet-based memory devices. The burst address control circuit includes a seed address selector for identifying a seed address, a counter, and a burst address look-up table for remapping predetermined internal addresses in the packet column address for signal interleaving. The burst address lookup table is responsive to the seed address and the counter value to identify the burst sequence of the internal addresses.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Burst or packet memory devices offer the ability to address one column of a memory array with a "packet" address and then automatically address additional columns in a predetermined manner without providing the additional internal column addresses on external address lines. This allows simultaneous accessing of multiple memory elements with a single address signal, dramatically improving the speed of the device. A more complete description of such a device is found, for example, in U.S. Pat. No. 5,812,488 entitled "Synchronous Burst Extended Data Out DRAM."

Figure 1:
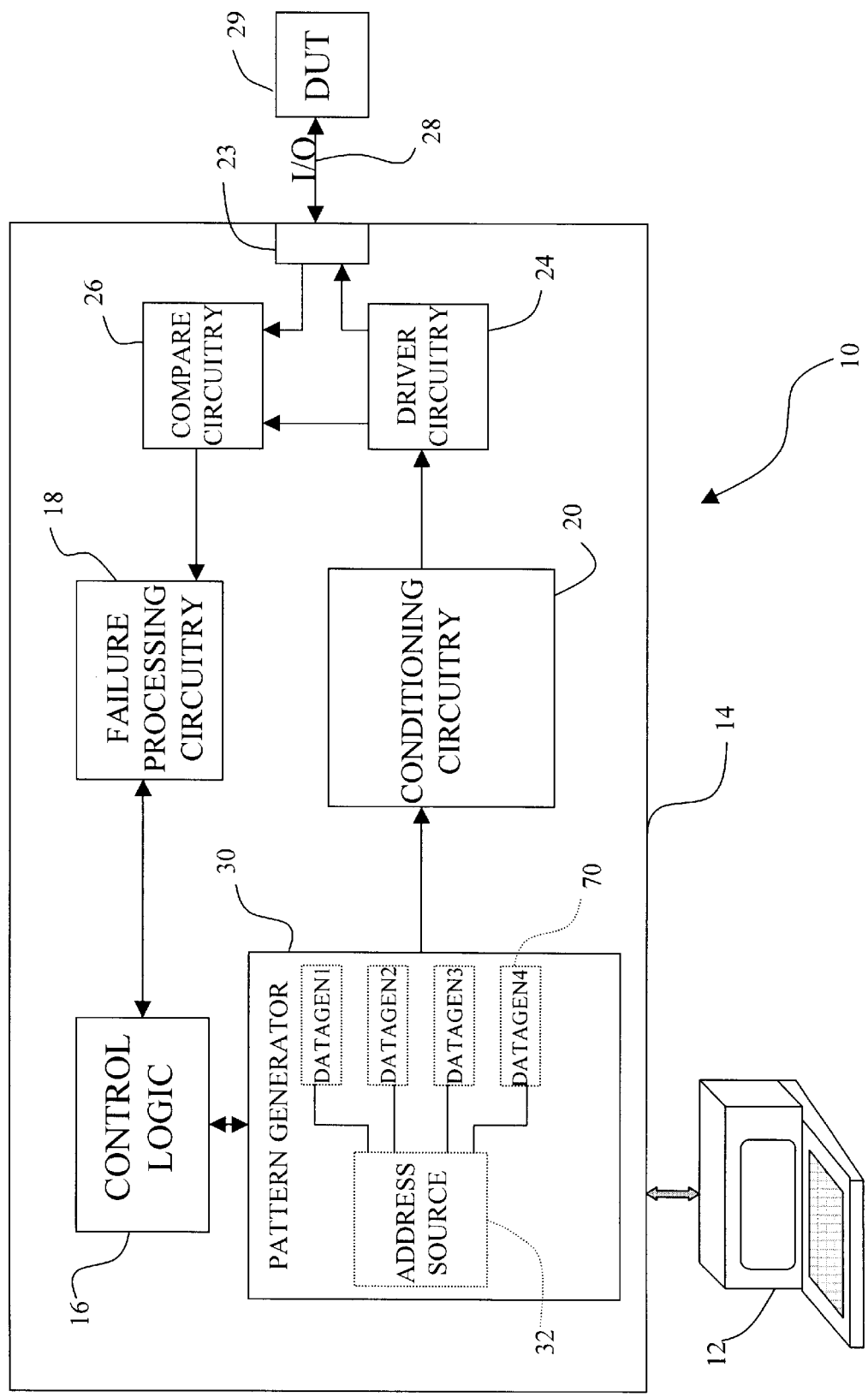
FIG. 1 is a block diagram of an automatic test system employing the pattern generator of the present invention.

Referring now to FIG. 1, an automatic test system 10 for testing such a device under test (DUT) 29, according to one form of the invention, includes a computer-based user workstation 12 coupled to a tester body 14. The tester body houses a plurality of tester sub-systems, including control logic 16, failure processing circuitry 18, and a pattern generator 30 to generate address and data signals. Conditioning circuitry 20 disposed at the output of the pattern generator carries out timing and formatting operations on the address and data signals. The tester body further includes a DUT interface 23 positioned proximate to the DUT. The DUT interface connects to driver circuitry 24 and compare circuitry 26 for driving and sensing signals to and from respective input/output (I/O) pins 28 of the DUT 29.

Further referring to FIG. 1, the pattern generator 30 of the present invention offers a straightforward hardware solution to generate the internal addresses associated with the individual data bits in a packet. This is accomplished by employing an address source 32 for generating a packet address and a plurality of data generation circuits 70 coupled to the address source to generate the data bits associated with the packet. Each data generation circuit includes logic 74 (FIG. 2) to derive respective internal addresses for the respective data bits.

Figure 2:
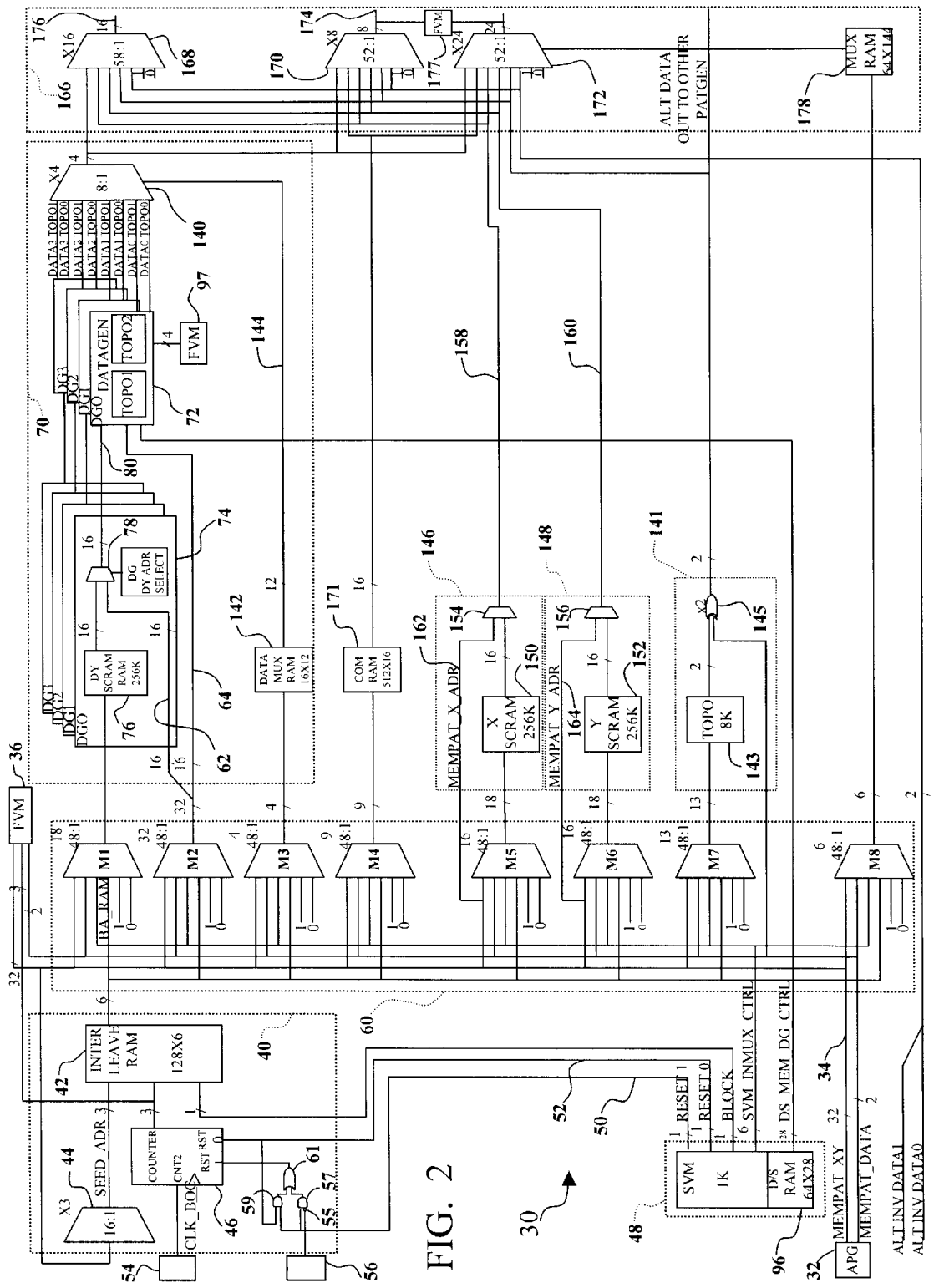
FIG. 2 is a block diagram of the pattern generator according to one embodiment of the present invention.

Referring now to FIG. 2, the address source 32 comprises an algorithmic pattern generator (APG) to algorithmically produce and feed packet addresses along an input address bus 34. The packet addresses are defined algorithmically in terms of row (X), column (Y) and bank (Z) locations within the DUT. Preferably, the algorithmic pattern generator comprises logic well known in the art to produce a 32-bit output for feeding packet X and Y address outputs MEMPAT_XY and optionally MEMPAT_DATA to the data generation circuits 70 and a fail vector memory (FVM) 36.

In many instances, the data bits in a packet may be ordered in different sequences. In order to accommodate variations in packetized sequencing, the pattern generator 30 optionally employs a burst address control circuit 40 (identified in phantom, FIG. 2) to allow various mappings of the data bits to occur based on a Y seed address. A seed address is the address of the first data bit in a packet. The burst address control circuit includes a 128×6 RAM 42 that receives the Y address seed address output from three 16:1 multiplexers 44 coupled to the address source 32. An internal counter 46 is provided to track the burst address and is responsive to a controller 48 via respective reset command lines 50 and 52. The counter includes a "count-by-two" mode input from a "count-by-two" circuit 54 for use during operation at 100 MHz. A 50 MHz mode circuit 56 produces a 50 MHz mode signal (when selected) that becomes inverted at 55 and is subsequently ANDed with the first reset signal by an AND gate 57. The output of the AND gate is connected to an OR gate 61. The OR gate includes as a second input the output from a second AND gate 59. The second AND gate is responsive to the reset 0 signal. Collectively, the AND gates 57 and 59, the inverter 55 and the OR gate 61 comprise a hold circuit. Based on the mode of the DUT 29, the burst address control circuit 40 generates a 6-bit output BA_RAM that provides the re-mapping information in the Y address for DDR interleaving.

Further referring to FIG. 2, the burst address control circuit output and the multi-bit address source outputs MEMPAT_XY and MEMPAT_DATA are distributed across an input multiplexer array 60. The array comprises several multiplexer groups M1–M8. Each multiplexer group includes a plurality of multiplexers that individually include input connections coupled to six groups of signal sources. The sources include the pattern memory XY address signals MEMPAT_XY, the pattern memory data signals MEMPAT_DATA, the burst address control circuit outputs, control output signals SVM_INMUX_CTRL from the controller 48 and respective signals for Logic 1 and Logic 0. The input multiplexer array collectively distributes and controls which bits get assigned to respective internal X and Y address busses 62 and 64 (via group M2). The input array multiplexers also select which bits address a DY scramble RAM 76 (via, group M1), an X scramble RAM 150 (group M5), a Y scramble RAM 152 (group M6), a data multiplexer RAM 142 (group M3), a command RAM 171 (group M4), a post topo RAM 143 (group M7) and an output multiplexer RAM 178 (group M8). The individual sources are selected by pre-programmed static registers (not shown) associated with each multiplexer.

Figure 3:
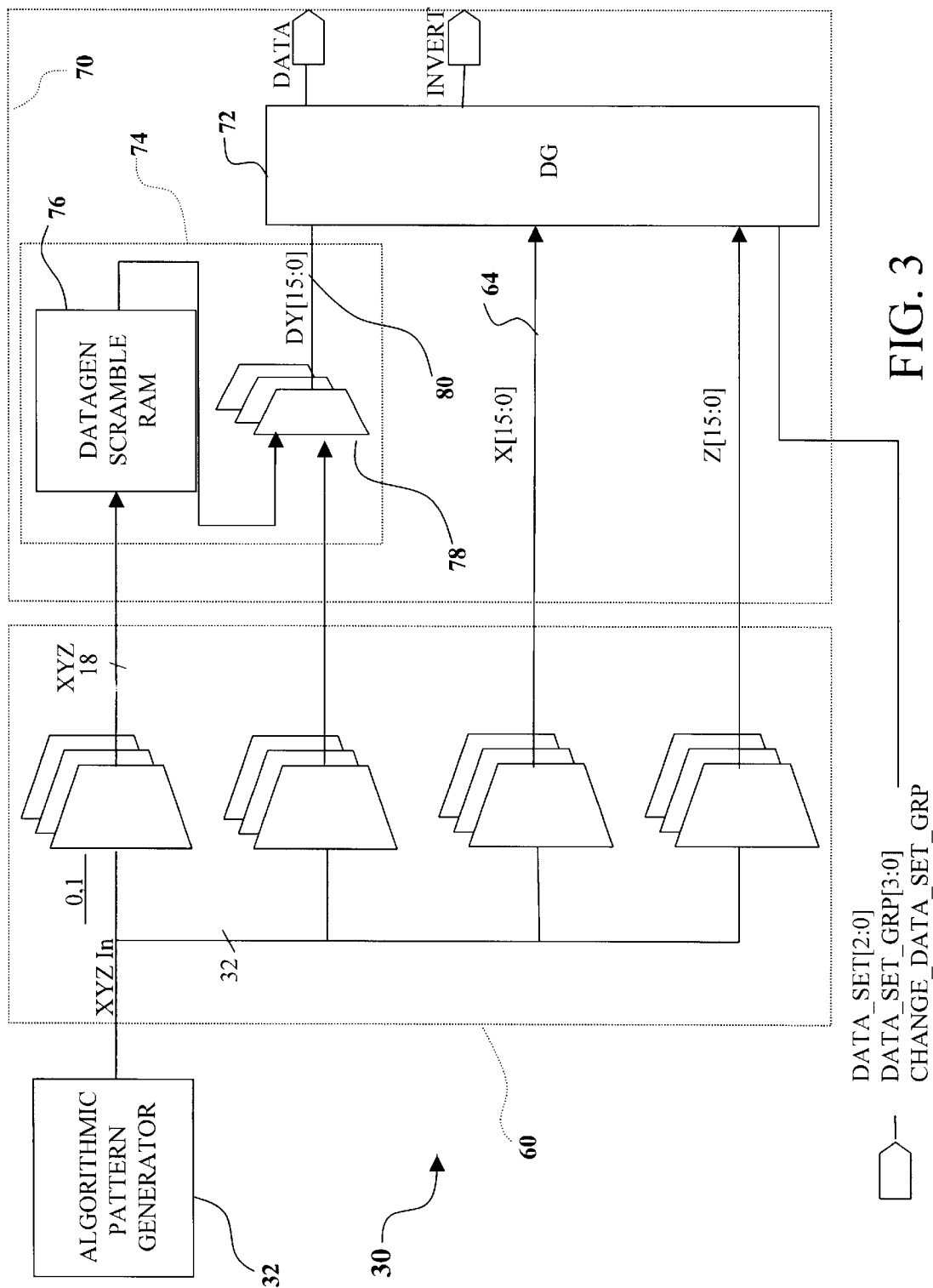
FIG. 3 is a block diagram of the pattern generator shown in FIG. 2.

Referring now to FIGS. 2 and 3, the pattern generator 30 includes a parallel configuration of four (or more) data generation circuits 70 to generate the individual data bits for packet burst lengths of four or eight. Each data generation circuit includes a data generator 72 and logic 74 that includes a DY scramble RAM 76 to derive the internal Y address for the data bit generated from the packet X, Y and Z address. The data generator receives the X address information directly from the X address bus 64. A per-bit bypass multiplexer 78 receives the output of the DY RAM 76 and the packet Y address from the Y address bus 62. The output of the multiplexer 78 is fed along a DY address bus 80 to an associated data generator 72 to provide a column address per packet data bit.

Figure 4:
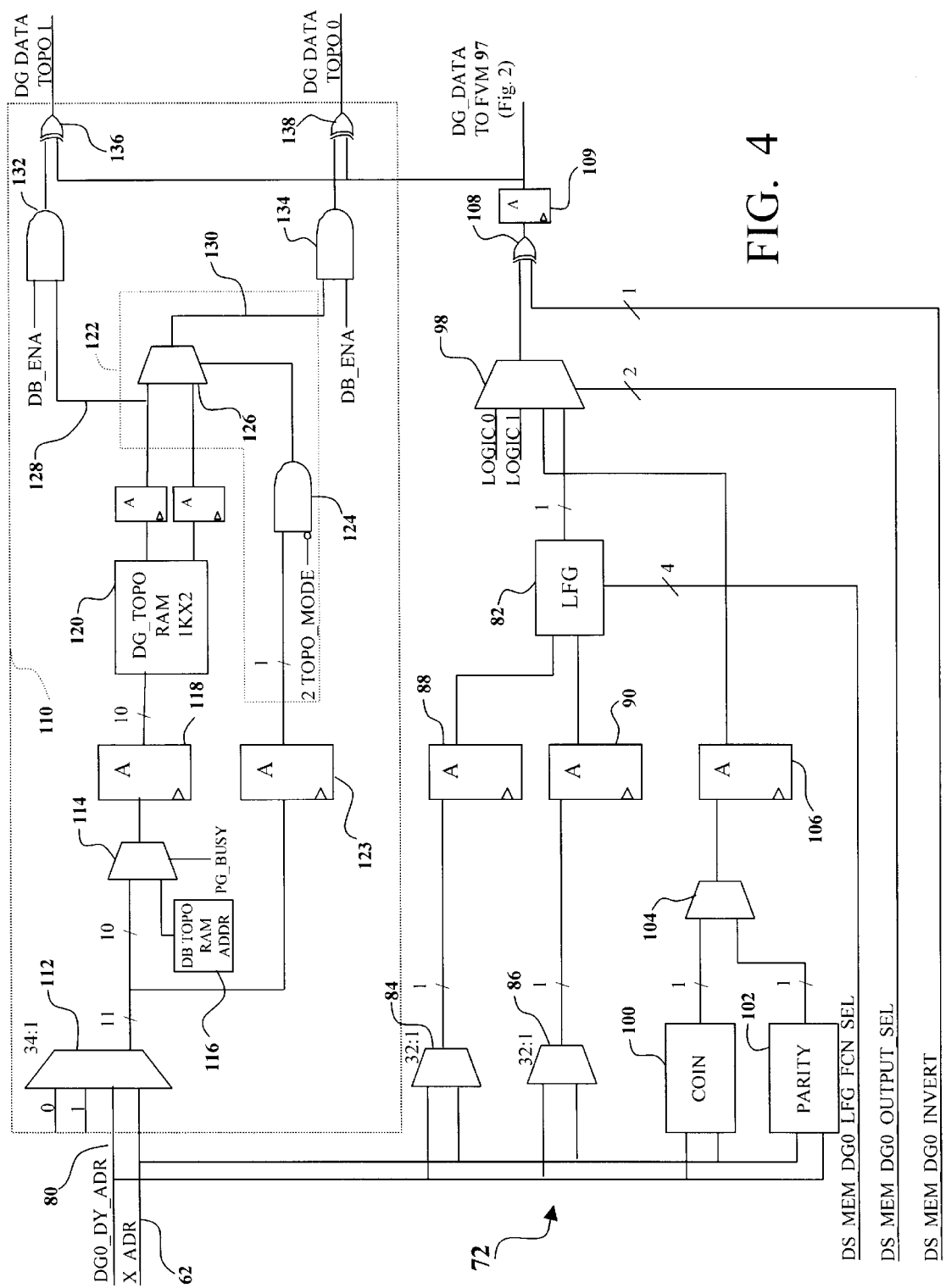
FIG. 4 is a block diagram of a data generator shown in FIG. 3.

With particular reference to FIG. 4, each data generator 72 includes a logic unction generator (LFG) 82 that receives source inputs from the incoming DY address bus 80 and the X address bus 62. A pair of 32:1 multiplexers 84 and 86 select between the incoming sources and distribute single-bit signals through respective six-bit static registers 88 and 90 for respective J and K bus inputs (not shown) of the LFG. The LFG operates according to a plurality of modes that are selectable via an LFG function select from a dataset RAM memory 96 (FIG. 2) located in the controller 48. Each data generator has its own field in the dataset RAM that allows each generator to select its logic function, output and invert independent from the other data generators.

Disposed at the output of the LFG 82 is a 4:1 multiplexer 98 that selects the data bit source according to a control signal DS_MEM_DGO_OUTPUT_SEL provided by the dataset memory 96. Other sources at the input to the multiplexer 98 besides the LFG include a coincidence/parity signal, and respective logic 1 and logic 0 bits. The coincidence/parity signal originates from respective coincidence and parity circuits 100 and 102 and is selected via a coin/parity multiplexer 104 that couples to a static register 106. The output of the source select multiplexer 98 is XORed by an XOR gate 108 with a pre-topo invert bit DS_MEM_DGO_INVERT from the dataset memory 96. This "pre-topo" output is then fed through a register 109 and to a second portion of the FVM memory 97 (FIG. 2) for subsequent comparison to captured data from the DUT 29.

Further referring to FIG. 4, each data generator 72 includes topological invert circuitry 110 (in phantom) to provide topological invert bits, if necessary. This feature is important since many DRAM memory core elements invert the data bit written to predetermined memory elements in the core. The topological invert circuitry takes into account any inverting by the DUT to maintain consistency for a user when thinking in terms of logic 1's and logic 0's.

The invert circuitry 110 includes a 34:1 input multiplexer 112 that receives the X address X_ADR, the DY address DG0_DY_ADR and Logic 0 and Logic 1 bits. The output of the multiplexer provides a 10-bit signal to a selector 114 that also receives as an input a databus topo RAM address from a topo RAM address generator 116. A PG_BUSY bit acts to select the source of the selector output. The output of the selector couples to a register 118 that provides a 10-bit address signal to a multi-mode topo RAM memory 120. An eleventh bit from the input multiplexer is coupled through a register 123 to function as a mode bit for mode selection logic 122. The mode selection logic 122 includes an AND gate 124 that AND's the mode bit with an inverted programmed mode signal 2TOPO_MODE to produce a control signal to an invert selector 126.

Output data bit paths 128 and 130 couple to the topo RAM 120 and include respective AND gates 132 and 134 that "AND" an enable signal DB_ENA with the respective invert bit(s) from the topo RAM. Respective XOR gates 136 and 138 receive the ANDed outputs and act to XOR the invert bit with the XORed DG_DATA bit from the LFG 82. The outputs of the respective XOR gates provide one or two data bits, depending on the topo RAM mode, for a particular data generator 72. Consequently, one bit from each data generator supports packet bursts of four, while two bits from each generator supports packet bursts of eight.

Referring back to FIG. 2, the data bits generated by the respective data generators 72 are fed to respective DGDATA selectors 140. The selectors are controlled by a 16×12 data mux RAM 142 via a data mux control bus 144. The data mux RAM generates four sets (one set for each data generator) of 3-bits for selection of one of the eight possible inputs.

To provide for conventional X and Y address scrambling, respective X and Y address scrambling circuits 146 and 148 are disposed between the pattern generator input and output multiplexer arrays 60 and 166. The scrambling circuits include respective 256K X and Y scramble RAMS 150 and 152 that act as lookup tables between the physical and logical X and Y addresses. The outputs of the scramble RAMs connect to respective selectors 154 and 156 that distribute the scrambled signals along respective X and Y scrambled address busses 158 and 160. Respective bypass connections 162 and 164 couple the unscrambled X and Y address signals to the selectors 154 and 156.

To provide post-topological invert information, a post-topo circuit 141 is implemented in the pattern generator 30. The post-topo circuit includes an 8K post-topo RAM 143 that provides a 2-bit output to a pair of XOR gates 145. The XOR gates perform an XOR function on the output of the post-topo RAM with the data signal MEMPAT_DATA. The XORed output is then fed as an alternate data signal ALT_DATA to another pattern generator module.

With continued reference to FIG. 2, the pattern generator 30 includes an output interface 166 that comprises a plurality of output address multiplexer arrays 168, 170 and 172 that distribute signals along a single address (ADS) bus 174 (shown for clarity in FIG. 2 as separate 8-bit and 24-bit busses) and a test head bus 176. The test head bus is conveniently implemented for region fail latch (RFL) applications that are well known in the art. The test head selector array 168 comprises a group of sixteen 58:1 multiplexers that individually receive as inputs respective alternate test head signals ALT_TH_BUS, DG data signals, scrambled X and Y address signals, post topo signals, alternative invert signals, logic 0 and logic 1 signals. The inputs are sequenced through the selector array 168 by pre-programmed static registers (not shown) to produce a 16-bit output for the test head bus 176.

For the ADS bus 174, upper and lower multiplexer arrays 170 and 172 similar to the test head selector array 168 are employed to distribute the various output signals. The upper ADS multiplexer array 170 distributes the upper 8 bits of the ADS bus according to pre-programmed static registers (not shown). The inputs to the upper multiplexer array are similar to those identified with the test head selector array except for the alternate test head signals. Moreover, the upper and lower multiplexer arrays include an input from a command RAM 171 that provides command packet data to the ADS bus 174. The lower ADS selector array 172 is similar to the other selector arrays and employs twenty-four 52:1 multiplexers to generate the lower 24 bits of the 32-bit ADS bus. Unlike the upper ADS selector, the lower ADS selector responds to source select bits from a 64-deep output mux RAM 178. The output of the mux RAM breaks down into 24 sets of 6-bits, with each bit going to one 52:1 multiplexer for the selection of the lower portion of the ADS bus (last 24 bits). The ADS bus couples to a third portion of the FVM 177.

Prior to operation, the DUT 29 is connected through the DUT interface 23 to the test head driver and compare circuitry 24 and 26. Depending on the type of DUT being tested, a test program comprising predetermined test control, address and data signals for each pin of the DUT will be loaded in the control logic 16, and monitored via the user workstation 12.

In operation, and referring now to FIG. 1, the control logic 16 carries out the sequence of programmed commands to activate the pattern generator 30 to produce address and data signals for application to the DUT 29. Generally, the pattern generator arithmetically produces packet addresses with the address source 32. Selected bits from the packet addresses are then fed through the parallel configuration of data generators 70 to generate the plurality of data bits associated with each packet address.

More specifically, and with reference to FIGS. 2 and 3, the pattern generator 30 operates by first distributing the algorithmically generated packet address MEMPAT_XY across the input multiplexer array 60. The packet address is also fed to the first portion of the FVM 36 and the burst address control circuit 40 through the seed address multiplexers 44.

The burst address control circuit 40 identifies the packet seed address for input to the burst address RAM 42. The counter 46 is initialized to begin counting once the seed address is detected. The processing of the count in conjunction with the seed address is determined by the operating mode of the DUT 29. For example, the DUT may be in interleave mode or linear mode, as is well known in the art. In either case, the re-mapping of the Y address by the burst address control circuit is often necessary. In interleave mode, a typical case is for the RAM under test to XOR the seed address with the internal count for each internal address location (or frame) as shown in the table below:

|  | seed address | count | internal address |
|---|---|---|---|
| frame0 | 3 | 0 | 3 |
| frame1 | 3 | 1 | 2 |
| frame2 | 3 | 2 | 1 |
| frame3 | 3 | 3 | 0 |
| frame4 | 3 | 4 | 7 |
| frame5 | 3 | 5 | 6 |
| frame6 | 3 | 6 | 5 |
| frame7 | 3 | 7 | 4 |

For a device in linear mode, the seed address determines the packet starting address. The internal address is then incremented for each data bit of the packet as shown in the table below:

|  | seed address | count | internal address |
|---|---|---|---|
| frame0 | 3 | 0 | 3 |
| frame1 | 3 | 1 | 4 |
| frame2 | 3 | 2 | 5 |
| frame3 | 3 | 3 | 6 |
| frame4 | 3 | 4 | 7 |
| frame5 | 3 | 5 | 0 |
| frame6 | 3 | 6 | 1 |
| frame7 | 3 | 7 | 2 |

The re-mapped packet address output generated by the burst address control circuit 40 is then distributed as a source input across the input multiplexer array 60.

In order to identify the internal addresses for the data generators 72, the logic 74 receives the packet XY information from the output of the first multiplexer group MI. The XY information addresses the datagen scramble RAM 76 that outputs the internal addresses of the DUT associated with the packet address. The internal addresses are derived by pre-programming the DY RAM consistent with the expected DUT mapping methodology. A per-bit bypass multiplexer 78 sequences the derived internal addresses generated by the DY RAM with Y address information on the Y address bus 62.

The DY internal addresses are then passed from the logic 74 to the data generators 72 over the DY address bus 80 (FIG. 4). The X address and DY address signals are distributed to the topological invert circuitry 110 and the logic function generator 82. The logic function generator then processes the address information according to a function set by the 4-bit mode select signal DS_MEM_DGO_LFG_FCN_SEL. The mode select determines what logic function will be performed on the 1-bit J and K inputs. The 1-bit result is based on the following table:

| FCN_SEL3 | FCN_SEL2 | FCN_SEL1 | FCN_SEL0 | FUNCTION |
|---|---|---|---|---|
| 0 | 0 | 0 | 0 | Zero |
| 0 | 0 | 0 | 1 | J* AND K* |
| 0 | 0 | 1 | 0 | J AND K* |
| 0 | 0 | 1 | 1 | K* |
| 0 | 1 | 0 | 0 | J* AND K |
| 0 | 1 | 0 | 1 | J* |
| 0 | 1 | 1 | 0 | J XOR K |
| 0 | 1 | 1 | 1 | J* OR K* |
| 1 | 0 | 0 | 0 | J AND K |
| 1 | 0 | 0 | 1 | J XNOR K |

-continued

| FCN_SEL3 | FCN_SEL2 | FCN_SEL1 | FCN_SEL0 | FUNCTION |
|---|---|---|---|---|
| 1 | 0 | 1 | 0 | J |
| 1 | 0 | 1 | 1 | J OR K |
| 1 | 1 | 0 | 0 | K |
| 1 | 1 | 0 | 1 | J* OR K |
| 1 | 1 | 1 | 0 | J OR K |
| 1 | 1 | 1 | 1 | One |

The LFG output is then used as an input source to the source select multiplexer 98, and XORed with the pre-topo invert bit DS_MEM_DG0_INVERT. The resultant output comprises the data bit for application to the derived DY address. The data bit output is stored in the second FVM portion 97 and distributed to respective XOR gates 136 and 138 for XORing with the generated invert bit(s).

The topological invert circuitry 110 also receives the X and DY address bits and sequences them through the input multiplexer 112. The sequenced address information is paired with the topo RAM address information from the topo RAM address generator 116 and distributed through the selector 114 to the address register 118. The register then produces the 10-bit topo RAM address to the topo RAM 120, which provides the invert bits for the data generator 72. The RAM acts as a configurable lookup table to produce invert bits based on the respective X and DY address busses 62 and 80. Programming the mode of the topo RAM configuration is accomplished via a databus (not shown). The programming specifies whether the RAM produces one or two invert bits, and correspondingly configures the RAM as a 1K deep (for two output bits) or 2K (for one output bit).

The topo RAM bit(s) are then output along the respective data paths 128 and 130 for eventual XORing with the LFG data bit by XOR gates 136 and 138.

Referring back to FIG. 2, the data bits are fed to the respective DGDATA selectors 140 for proper packet sequencing to the output multiplexer array 166 as governed by the data mux RAM 142. The data bits are distributed via the test head selector 168 to the test head bus 176, and by the ADS selectors 170 and 172 to the ADS bus 174.

Referring now to FIG. 1, the address and data signals generated by the pattern generator 30 are then fed to the conditioning circuitry 20 that formats and modifies the address and data signals to match the DUT signal format. The generated address and data signals are also stored in the FVM (FIG. 2) 177 to later provide a comparison to captured data signals from the DUT at the same address locations.

The formatted packet address and data signals are then applied to the appropriate memory elements of the DUT 29 by the driver circuitry 24. The individual memory elements are loaded by the DUT according to the packet address and a DUT mapping methodology. Those skilled in the art will appreciate that by deriving the internal addresses for the individual data bits in each packet based on the DUT's mapping technique, the tester is able to keep track of the actual memory element address in the FVM 177.

The data bits written to the DUT are subsequently read therefrom by the compare circuitry 26 that captures packets of data bits identified by respective packet addresses from the DUT. The captured packet signals are fed to the failure processing circuitry 18 where they are compared to re-generated address and data signals from the pattern generator. If the captured data signals match expected values, then the corresponding memory elements of the DUT are deemed acceptable for the particular test carried out.

Figure 5:
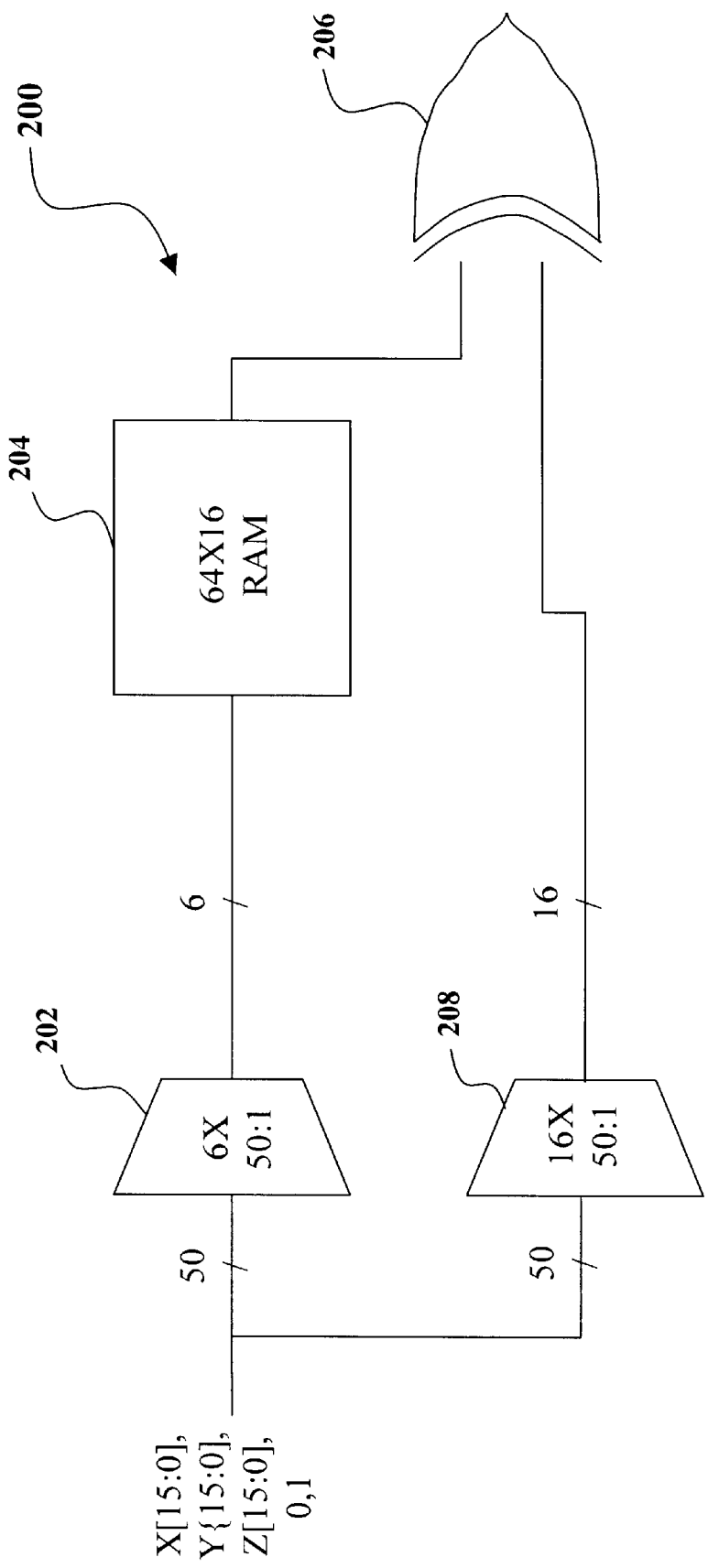
FIG. 5 is a block diagram of a data generator according to a second embodiment of the present invention.

Referring now to FIG. 5, a logic circuit 200 for use in a data generator according to a second embodiment of the present invention minimizes the amount of memory required to derive an internal Y address from a packet Y address. the logic circuit includes a first array of six 50:1 multiplexers 202 that produce a six-bit input to a relatively small 64×16 RAM 204. The RAM stores information relating to Y address discontinuities to minimize the amount of information required to derive the internal Y address. The output of the RAM is XORed by an XOR gate 206 with the output of a second multiplexer array 208 that outputs a 16-bit nominal Y address.

Unlike the logic 74 disclosed in the first embodiment, which utilizes a RAM that provides a DG Y address output, the RAM employed in the second embodiment merely indicates when to invert a Y address based on predetermined criteria. The width of the RAM is determined by the width of the DG Y address. The depth of the RAM, on the other hand, is determined by how many discontinuities there are. Examples of discontinuities include cases where:

(1) one-half of an array is the mirror of the other half, requiring one bit to describe (the most-significant-bit of that axis);

(2) column lines twist halfway down the array, requiring one bit to describe (the most-signficant-bit of the X address);

(3) two-column bits that twist halfway down the array, requiring one bit to describe (the most significant bit of the X address); and (4) four-column bits that twist halfway down the array, requiring 3 bits to describe (the MSB of the X address, and the 2LSBs of the Y address).

The last case assumes that the same data generator writes all four bits, or in other words, only one of the four bits is written per packet. If all four bits are written in the same packet, then only one bit is required, and two output bits are required which describes which of the four bit positions the data generator is addressing.

Those skilled in the art will appreciate the many benefits and advantages afforded by the present invention. Of significant importance is the minimal hardware required to derive internal column addresses from packet addresses through use of the data generator logic. Not only does this allow implementation of relatively few conventional address sources, but it minimizes any required modifications for conventional testers to the data generator construction.

While the invention has been particularly shown and described with reference to the preferred embodiments thereof, it will be understood by those skilled in the art that various changes in form and detail may be made therein without departing from the spirit and scope of the invention.

What is claimed is:

1. A pattern generator for use in a memory tester to provide packet address and data signals to a packet-based memory-under-test, said pattern generator including:

an address source for generating an external packet memory address signal representative of a plurality of addressable memory elements in said memory-under-test;

a plurality of data generators disposed in parallel relationship and coupled to the output of said address source to receive at least a portion of said packet memory address signal, each of said data generators having logic operative to derive an internal address from said packet address, said internal address corresponding to an individual memory element with said plurality of memory elements in said memory-under-test;

a sequencer disposed at the outputs of said data generators to distribute said data generator outputs in a packet waveform for application to said memory-under-test; and a burst address control circuit for determining a burst sequence of internal address data, wherein said burst address control circuit includes:

a seed address selector for identifying a seed address;

a counter, and a burst address lookup table for remapping predetermined internal addresses in packet column address for signal interleaving, said burst address lookup table responsive to said seed address and a counter value to identify the burst sequence of said internal addresses.

2. A pattern generator according to claim 1 wherein:

said address source comprises an algorithmic pattern generator.

3. A pattern generator according to claim 1 wherein:

said plurality of data generators are coupled to the output of said address source to receive a packet column address signal; and said logic is operative to derive said internal addresses from said packet address.

4. A pattern generator according to claim 1 for use in a memory tester to test a memory-under-test, said memory-under-test having logic to map column address information according to a predetermined scrambling sequence, wherein:

said logic includes a look-up table to inversely scramble said column address information with respect to said predetermined scrambling sequence.

5. A pattern generator according to claim 4 wherein:

said look-up table comprises a scramble RAM.

6. A pattern generator according to claim 1 wherein:

said burst address look-up table comprises a RAM.

7. A pattern generator according to claim 1 wherein:

said sequencer is responsive to said burst address control circuit to change the order of said data generator outputs within said packet.

8. A semiconductor memory tester including:

a user workstation;

a tester body responsive to said user workstation and including control logic for generating test commands;

a pattern generator for generating packet address and data signals for application to said memory-under-test, said pattern generator including an address source and a plurality of data generators coupled in parallel to said address source, said data generators having logic to receive a portion of said packetized address signal and operative to derive respective internal addresses of said memory-under-test from said packetized address and a sequencer to distribute said data generator outputs into a packetized waveform; wherein the pattern generator further including a burst address control circuit for determining a burst sequence of internal address data, wherein said burst address control circuit also includes a seed address selector for identifying a seed address, a counter, and a burst address lookup table for remapping predetermined internal addresses in packet column address for signal interleaving, said burst address lookup table responsive to said seed address and a counter value to identify the burst sequence of said internal addresses;

conditioning circuitry disposed at the output of said sequencer to format said waveform; and interface circuit adapted to couple to said memory-under-test to drive signals to and compare signals from said memory-under-test.

* * * * *